(12) United States Patent
Kodama et al.

(10) Patent No.: US 9,882,164 B2
(45) Date of Patent: Jan. 30, 2018

(54) ORGANIC EL DISPLAY MODULE

(71) Applicant: Futaba Corporation, Mobara-shi, Chiba (JP)

(72) Inventors: Mitsufumi Kodama, Mobara (JP); Ikuo Ohmori, Kitaibaraki (JP); Shinji Ide, Mobara (JP); Shigeyuki Ishiguro, Kitaibaraki (JP); Fumio Kimura, Kitaibaraki (JP)

(73) Assignee: FUTABA CORPORATION, Chiba (JP)

( * ) Notice: Subject to any disclaimer, the term of this patent is extended or adjusted under 35 U.S.C. 154(b) by 0 days.

(21) Appl. No.: 15/165,860

(22) Filed: May 26, 2016

(65) Prior Publication Data

US 2016/0351848 A1    Dec. 1, 2016

(30) Foreign Application Priority Data

May 28, 2015   (JP) ................. 2015-108477

(51) Int. Cl.
*H01L 51/52* (2006.01)
*H01L 51/00* (2006.01)
*H01L 27/32* (2006.01)

(52) U.S. Cl.
CPC ........ *H01L 51/5246* (2013.01); *H01L 27/323* (2013.01); *H01L 51/0097* (2013.01); *H01L 51/5237* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| 9,013,432 B2 | 4/2015 | Kang et al. |
| 2010/0164888 A1* | 7/2010 | Okumura ............ G06F 1/1626 345/173 |
| 2012/0113614 A1* | 5/2012 | Watanabe ........... G02F 1/13336 361/810 |
| 2014/0233194 A1 | 8/2014 | Hongo et al. |

FOREIGN PATENT DOCUMENTS

| CN | 103872083 | 6/2014 |
| CN | 104464527 | 3/2015 |
| CN | 204229762 U | 3/2015 |
| EP | 2 555 089 | 2/2013 |
| JP | 2009-187913 | 8/2009 |
| JP | 2011-085740 | 4/2011 |

(Continued)

OTHER PUBLICATIONS

Office Action issued in counterpart Taiwanese Patent Application No. 105115966, dated Dec. 7, 2016, 3 pages.

*Primary Examiner* — Lex Malsawma
(74) *Attorney, Agent, or Firm* — Hamre, Schumann, Mueller & Larson, P.C.

(57) ABSTRACT

The organic EL display module includes an organic EL display device having flexibility, a touch panel having flexibility, a first adhesive portion for attaching the organic EL display device and the touch panel to each other, a curved and flexible intermediate housing disposed on an opposite side from the organic EL display device with respect to the touch panel, and a second adhesive portion for attaching the touch panel and the intermediate housing to each other.

14 Claims, 14 Drawing Sheets

(56) References Cited

FOREIGN PATENT DOCUMENTS

| | | |
|---|---|---|
| JP | 2014-509028 | 4/2014 |
| JP | 3193457 U | 10/2014 |
| JP | 2014-535086 | 12/2014 |
| JP | 2015-501461 | 1/2015 |
| TW | 201327510 | 7/2013 |
| TW | 201432640 | 8/2014 |

* cited by examiner

*Fig.4A*        *Fig.4B*
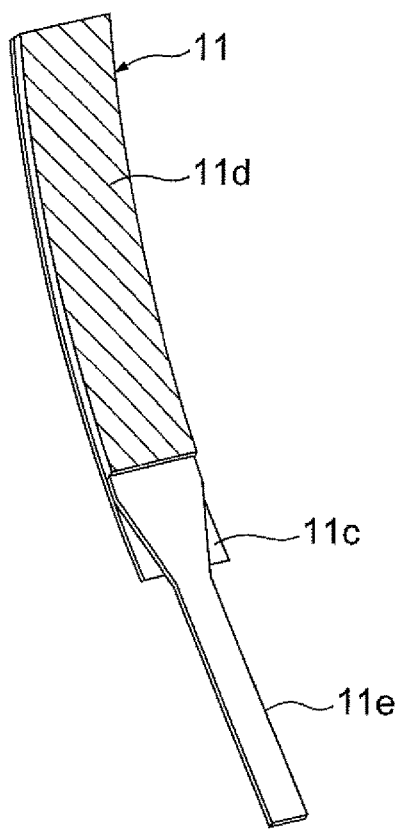
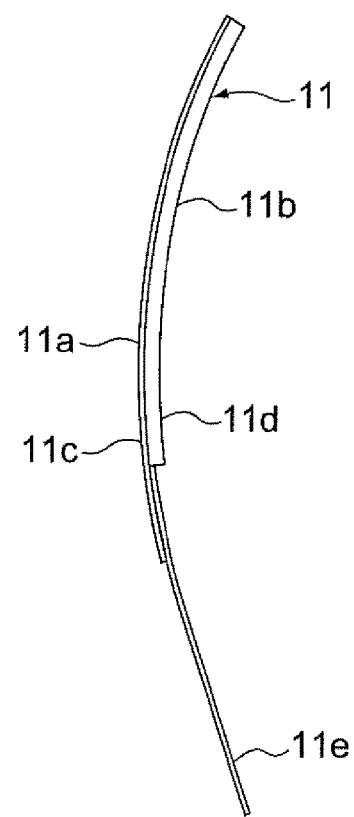

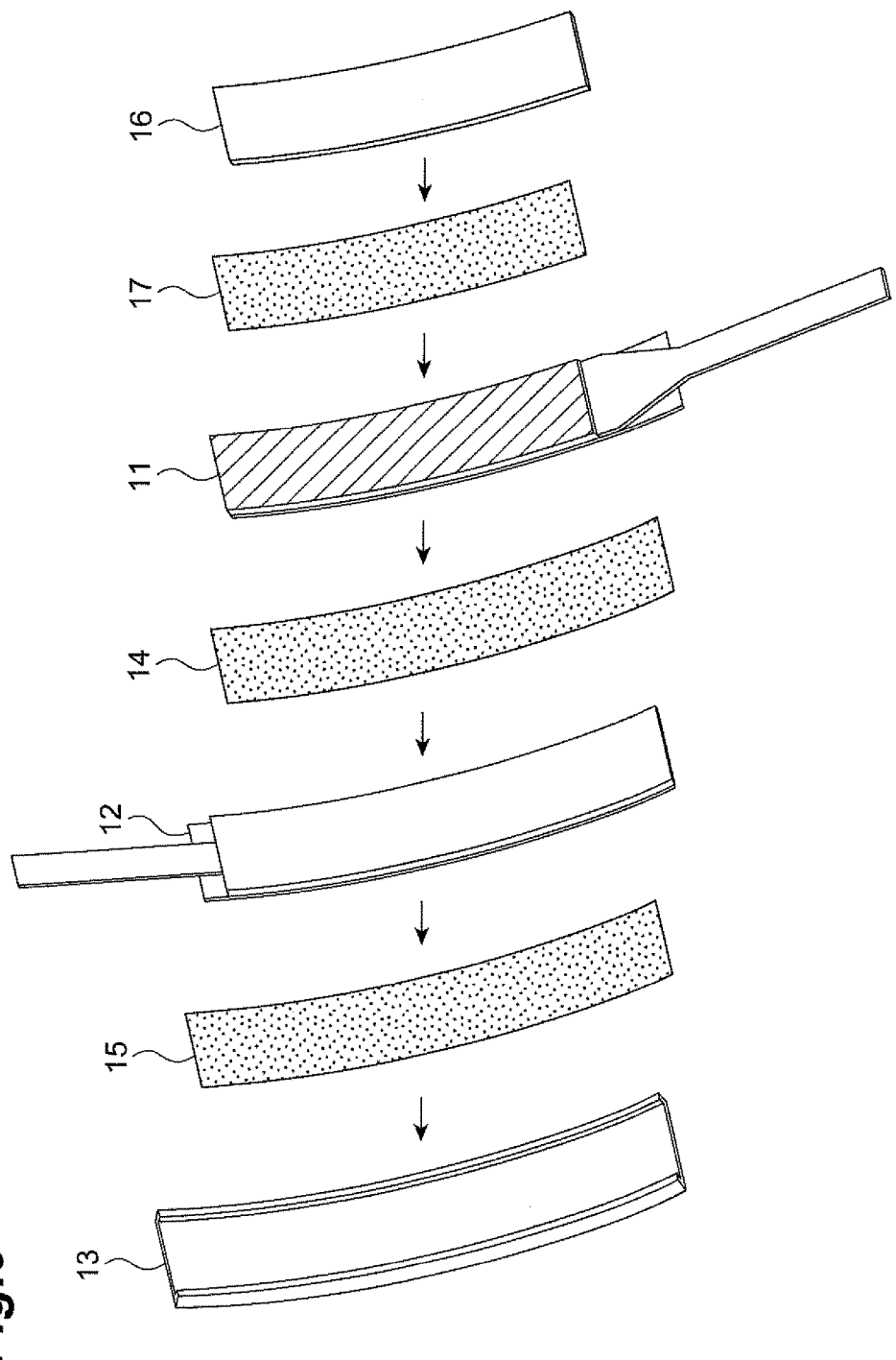

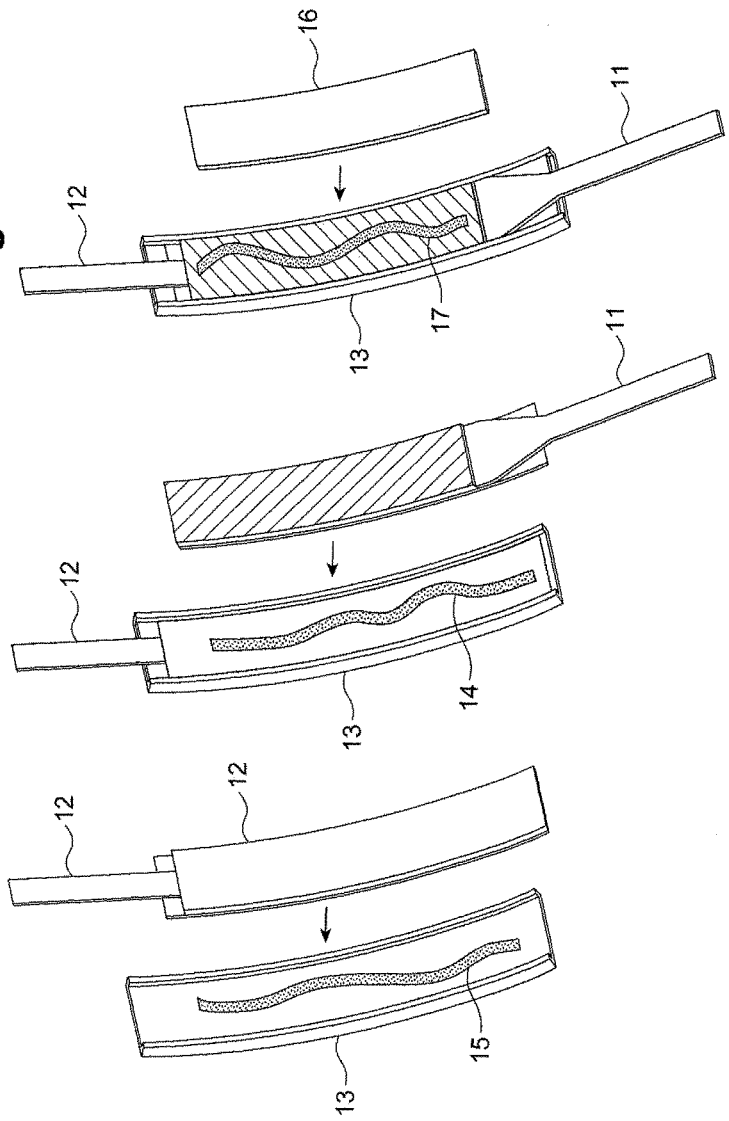

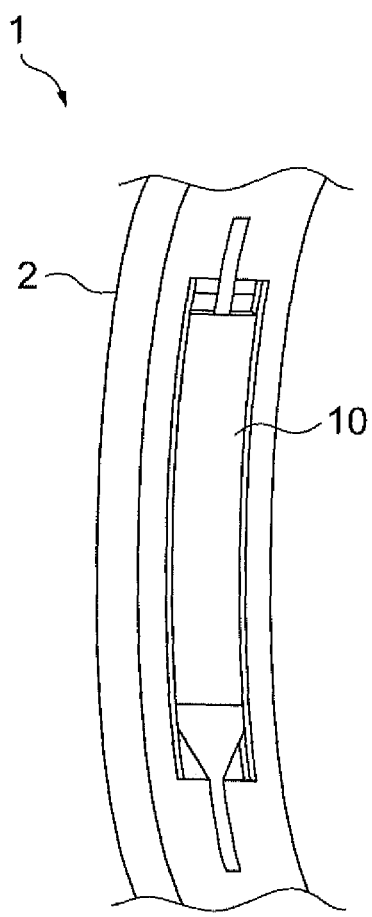

ORGANIC EL DISPLAY MODULE

TECHNICAL FIELD

The present invention relates to an organic EL display module in which an organic EL display device is integrated with a touch panel.

BACKGROUND

Recently, a wearable device worn on a body such as a watch, glasses or clothes has been actively developed as a type of electrical equipment terminal. The wearable device mainly includes a housing that forms an appearance of the wearable device, a display device assembled with the housing, and a touch panel. The wearable device is curved to fit along a line of the body. For this reason, a film organic EL display panel (hereinafter referred to as "film OLED"), which uses an organic resin film having flexibility as a substrate, is used as the display device (for example, see Japanese Utility Model Registration No. 3193457). In addition, a film touch panel (hereinafter, referred to as "film TP"), which uses an organic resin film having flexibility as a substrate, is used as the touch panel.

SUMMARY

Incidentally, a final product manufacturing company that manufactures a wearable device corresponding to a final product orders intermediate components such as a housing, an organic EL display device, or a touch panel included in the wearable device from an intermediate component manufacturing company, and assembles the intermediate components in the final product manufacturing company.

A film OLED and a film TP are assembled with a housing by bonding the film OLED and the film TP to the housing using an OCR (optically clear resin) or an OCA (optically clear adhesive). However, this operation has a high level of difficulty, and thus a yield in an operation process thereof is poor. That is, substrates of the film OLED and the film TP are thin and easily damaged, and thus the film OLED and the film TP are likely to incur a malfunction due to disconnection, a short circuit, and the like. In addition, the substrates of the film OLED and the film TP have flexibility, and thus there is difficulty in treating the film OLED and the film TP, and a junction between an IC (integrated circuit) and a flexible printed circuit is easily damaged. Further, when a design of the wearable device corresponding to the final product is complicated, or many electronic components are disposed inside the housing, a restriction on installation of the OCR or the OCA increases.

A manufacturing worker of the final product manufacturing company may not be skilled in treating the organic EL display device and the touch panel. For this reason, a malfunction is highly likely to occur in the organic EL display device or the touch panel in a process of manufacturing the wearable device corresponding to the final product.

Further, the wearable device requires high water repellency, and thus the whole wearable device is resin-molded. For this reason, when malfunctions of the film OLED and the film TP are detected after the wearable device is completed, the final product becomes a defective product. In this case, the amount of loss is significantly great when compared to a case in which a defect is detected from the film OLED and the film TP before assembly.

In this regard, an object of the invention is to provide an organic EL display module capable of suppressing occurrence of a malfunction of the organic EL display device or the touch panel in the process of manufacturing the wearable device corresponding to the final product.

As a result of a keen examination of the above-mentioned problem, the present inventors have found that the above-mentioned problem can be solved by integrating the organic EL display device and the touch panel into one module.

That is, an organic EL display module according to an aspect of the present invention includes an organic EL display device having flexibility, a touch panel having flexibility, a first adhesive portion for attaching the organic EL display device and the touch panel to each other, a curved intermediate housing disposed on an opposite side from the organic EL display device with respect to the touch panel, and a second adhesive portion for attaching the touch panel and the intermediate housing to each other.

In the organic EL display module according to the aspect of the present invention, when the organic EL display device and the touch panel are attached to the intermediate housing by the first adhesive portion and the second adhesive portion, the organic EL display device and the touch panel are easily integrated into one module. In this way, a handling property of the module is improved. Thus, when the module is assembled as a wearable device corresponding to a final product, it is possible to suppress occurrence of a malfunction of the organic EL display device or the touch panel. Further, the organic EL display device and the touch panel have flexibility, and the intermediate housing is curved. Thus, the organic EL display module can be easily assembled with a wearable device which has a curved design.

The intermediate housing may have flexibility. When the intermediate housing has flexibility, the organic EL display module can be easily assembled with a wearable device which has various shapes.

The organic EL display device and the touch panel may be disposed on a side of a concave surface of the intermediate housing. In this organic EL display module, since the organic EL display device and the touch panel are disposed on the side of the concave surface of the intermediate housing, the handling property of the module can be further improved, and damage to the organic EL display device and the touch panel can be further suppressed.

The intermediate housing may be formed in a rectangular plate shape, and first convex portions protruding to a side of the organic EL display device may be formed in end portions on sides of long sides of the intermediate housing. In this organic EL display module, the first convex portions are formed in the end portions on the sides of the long sides of the intermediate housing. Thus, when the organic EL display device and the touch panel come into contact with the first convex portions, the organic EL display device and the touch panel can be aligned with respect to the intermediate housing at high accuracy.

The intermediate housing may be curved such that the long sides of the intermediate housing become curves, and the first convex portions may extend along the long sides of the intermediate housing. In this organic EL display module, since the first convex portions extend along the long sides that become the curves, a shape-retaining property of the curved intermediate housing is improved.

Second convex portions protruding to the side of the organic EL display device may be formed in end portions on sides of short sides of the intermediate housing, and the first convex portions and the second convex portions may be connected to each other. In this organic EL display module, when the first convex portions and the second convex portions are connected to each other, corners of the intermediate housing are connected in three axial directions. For this reason, the shape-retaining property of the intermediate housing is further improved.

The intermediate housing may be formed in a rectangular plate shape, and marks for alignment may be formed in end portions on sides of long sides of the intermediate housing. In this organic EL display module, the marks for alignment are formed in the end portions on the sides of the long sides of the intermediate housing. Thus, the organic EL display device and the touch panel can be aligned with respect to the intermediate housing at high accuracy based on the marks.

The intermediate housing may be formed using a transparent silicone resin. In this organic EL display module, since the intermediate housing is formed using the transparent silicone resin, a shape of the intermediate housing can be easily changed. In this way, even when a design of the wearable device corresponding to the final product is complicated, the module can be easily assembled. Further, an impact resistance of the intermediate housing can be improved.

Each of the first adhesive portion and the second adhesive portion may be at least one of a transparent resin tape and a transparent resin adhesive. In this organic EL display module, the organic EL display device, the touch panel, and the intermediate housing are bonded together using at least one of the transparent resin tape and the transparent resin adhesive. Thus, the organic EL display device, the touch panel, and the intermediate housing can be reliably bonded together while ensuring visibility of the organic EL display device.

The first adhesive portion and the second adhesive portion may be transparent resin adhesives, and a space between the organic EL display device and the touch panel, and a space between the touch panel and the intermediate housing may be filled with the resin adhesives. In this organic EL display module, the organic EL display device, the touch panel, and the intermediate housing are bonded together using the transparent resin adhesives, and the spaces are filled with the resin adhesives. Thus, the organic EL display device, the touch panel, and the intermediate housing can be more reliably bonded together while ensuring visibility of the organic EL display device.

A radius of curvature of the intermediate housing may be 8 mm or more and 200 mm or less. In this organic EL display module, since the radius of curvature of the intermediate housing is 8 mm or more and 200 mm or less, the intermediate housing can be easily assembled with the wearable device which has the curved design to fit along a line of a human body.

A thickness of the intermediate housing may be 0.05 mm or more and 2 mm or less. In this organic EL display module, since the thickness of the intermediate housing is 0.05 mm or more and 2 mm or less, rigidity of the module can be maintained while preventing the wearable device corresponding to the final product from becoming excessively thick.

An organic EL display element may be formed on a substrate of the organic EL display device, and a thickness of the substrate may be 0.2 mm or less. In this organic EL display module, since the thickness of the substrate of the organic EL display device is 0.2 mm or less, the organic EL display device can be easily bent.

The organic EL display module may further include a protection portion disposed on an opposite side from the touch panel of the organic EL display device. In this organic EL display module, since the protection portion is disposed on the opposite side from the touch panel of the organic EL display device, the organic EL display device and the touch panel are interposed between the intermediate housing and the protective portion. In this way, damage to the organic EL display device and the touch panel can be further suppressed.

According to an aspect of the present invention, it is possible to suppress occurrence of a malfunction of the organic EL display device or the touch panel in a process of manufacturing the wearable device corresponding to the final product.

BRIEF DESCRIPTION OF THE DRAWINGS

FIG. 4A is a perspective view of an organic EL display device;
FIG. 4B is a side view of an organic EL display device;
FIG. 9 is a diagram for description of a method of manufacturing the organic EL display module using a resin tape;
FIGS. 10A, 10B and 10C are a diagram for description of a method of manufacturing the organic EL display module using a resin adhesive;
FIG. 11 is a perspective view illustrating a state in which the organic EL display module is assembled with the housing.

DETAILED DESCRIPTION

Figure 1A:
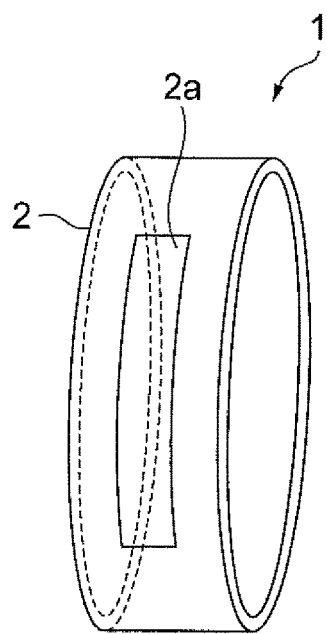
FIGS. 1A and 1B are a perspective view of a wearable device with which an organic EL display module of a first embodiment is assembled.

Hereinafter, preferred embodiments of the invention will be described with reference to drawings. The same reference numeral will be applied to the same or equivalent component in each drawing, and a repeated description will be omitted.

First Embodiment

Figure 1B:
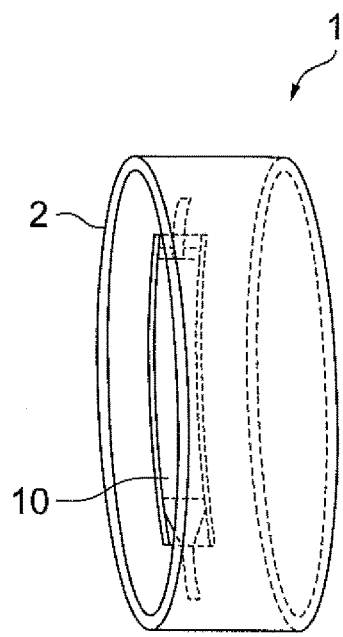

FIGS. 1A and 1B are a perspective view of a wearable device with which an organic EL display module of a first embodiment is assembled. As illustrated in FIGS. 1A and 1B, the wearable device 1 has a curved shape along a line of a human body such that a user wears the wearable device 1. The wearable device 1 includes a housing 2 that forms an, appearance of the wearable device 1 and an organic EL display module 10 assembled with the housing 2. A depression for inserting the organic EL display module 10 is formed on an interior surface side of the housing 2, and a display unit 2a for visually recognizing a display of the organic EL display module 10 is formed on an exterior surface side of the housing 2. In addition, the organic EL display module 10 is assembled with the wearable device 1 (housing 2) by being inserted into the depression formed on the interior surface side of the housing 2. In the present embodiment, even though a description is given on the assumption that the wearable device 1 corresponds to a watch type, a shape of the wearable device, or the like is not particularly restricted.

Figure 2:
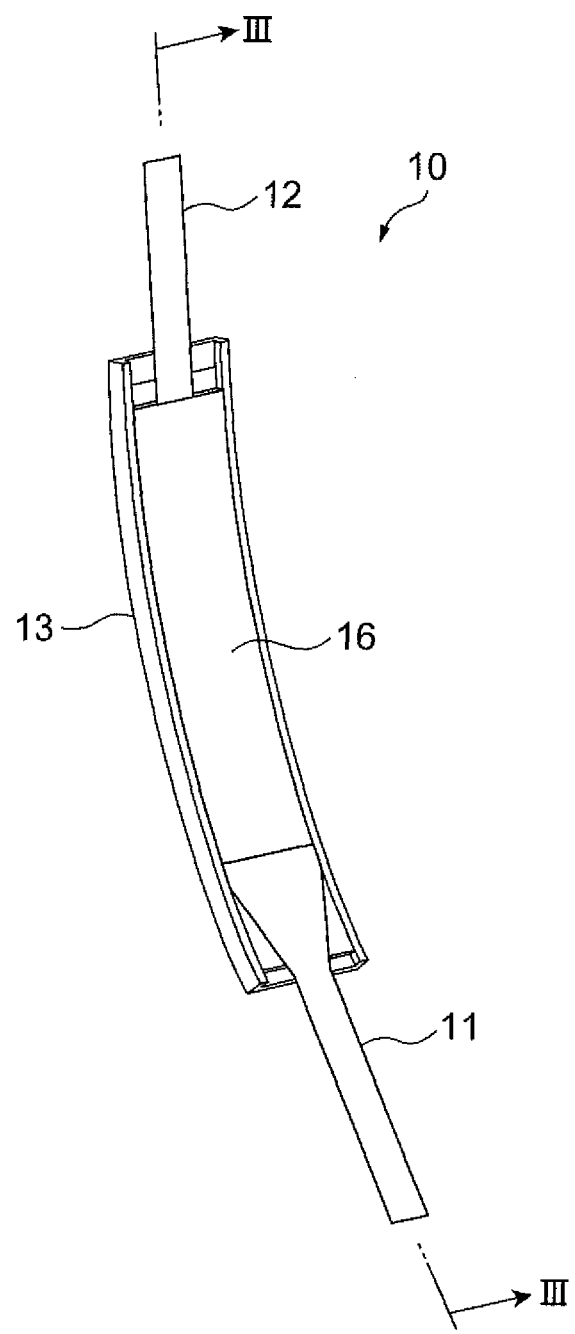
FIG. 2 is a perspective view of the organic EL display module of the first embodiment.
Figure 3:
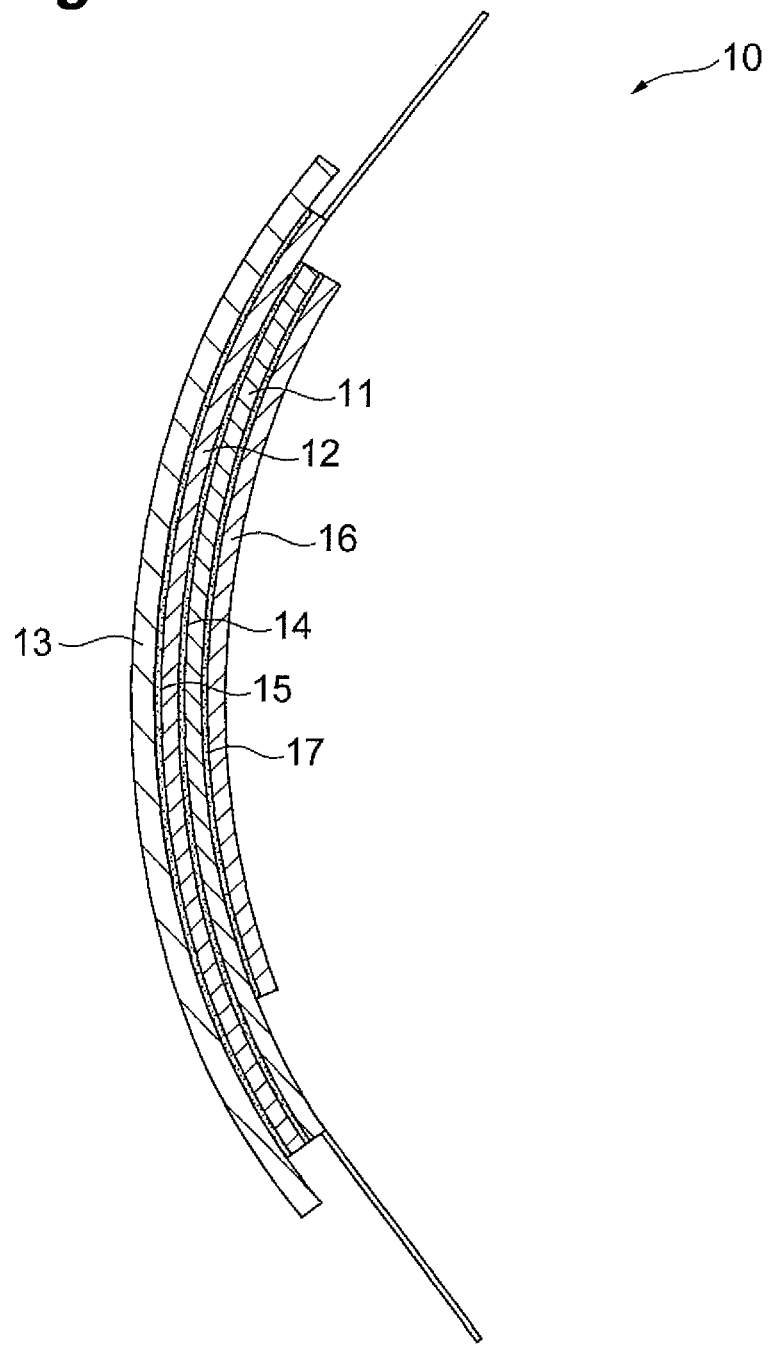
FIG. 3 is a cross-sectional view taken along III-III line of FIG. 2.

FIG. 2 is a perspective view of the organic EL display module of the first embodiment. FIG. 3 is a cross-sectional view taken along III-III line of FIG. 2. As illustrated in FIG. 2 and FIG. 3, the organic EL display module 10 of the present embodiment includes an organic EL display device 11, a touch panel 12, an intermediate housing 13, a first adhesive portion 14, a second adhesive portion 15, a protective portion 16, and a third adhesive portion 17.

FIG. 4A is a perspective view of the organic EL display device, and FIG. 4B is a side view of the organic EL display device. As illustrated in FIG. 2 to FIG. 4B, the organic EL display device 11 is a display device that displays information. The organic EL display device 11 has flexibility, and is formed in a curved rectangular film shape. Herein, in surfaces of the organic EL display device 11 facing each other, a convexly curved surface is referred to as a convex surface 11a, and a concavely curved surface is referred to as a concave surface 11b.

In the organic EL display device 11, an organic EL display element 11d is formed on a first substrate 11c. The first substrate 11c is a resin film having flexibility. A thickness of the first substrate 11c is preferably 0.01 mm or more and 0.2 mm or less, and more preferably 0.02 mm or more and 0.15 mm or less. The organic EL display element 11d is a display element using a light emitting diode, which contains an organic compound, as a luminescent layer. A flexible printed circuit 11e, which is connected to a controller (not illustrated) such as a CPU incorporated in the wearable device 1, is connected to the organic EL display element 11d. For example, a known film OLED can be used as the organic EL display device 11.

Figure 5A:
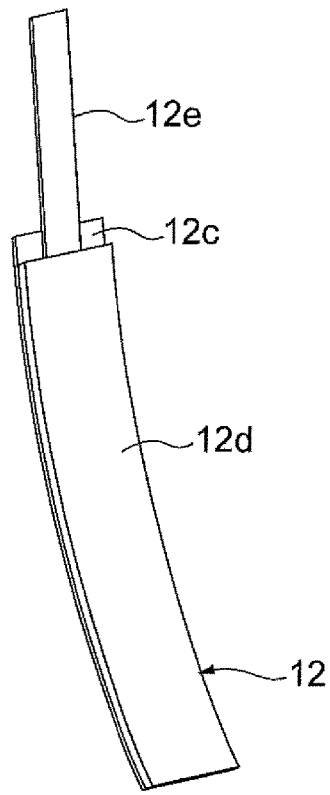
FIG. 5A is a perspective view of a touch panel.
Figure 5B:
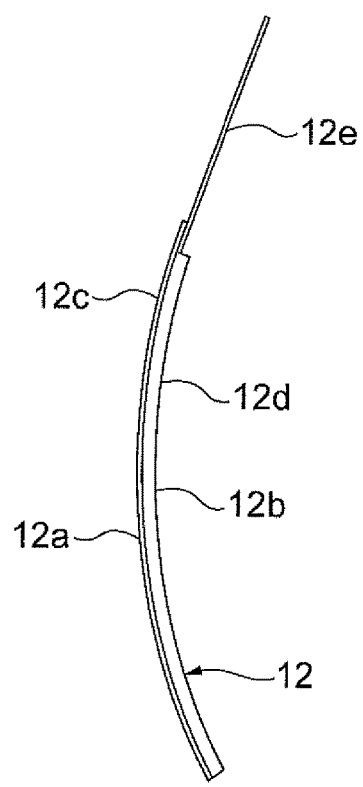
FIG. 5B is a side view of a touch panel.

FIG. 5A is a perspective view of the touch panel, and FIG. 5B is a side view of the touch panel. As illustrated in FIG. 2, FIG. 3, and FIGS. 5A and 5B, the touch panel 12 is a contact detector that detects contact by the user of the wearable device 1 or the like. Similarly to the organic EL display device 11, the touch panel 12 has flexibility, and is formed in a curved rectangular film shape. Herein, in surfaces of the touch panel 12 facing each other, a convexly curved surface is referred to as a convex surface 12a, and a concavely curved surface is referred to as a concave surface 12b. In addition, the concave surface 12b of the touch panel 12 is attached to the convex surface 11a of the organic EL display device 11.

In the touch panel 12, a touch sensor 12d is formed on a second substrate 12c. The second substrate 12c is a resin film having flexibility. A thickness of the second substrate 12c is preferably 0.01 mm or more and 0.2 mm or less, and more preferably 0.02 mm or more and 0.15 mm or less. The touch sensor 12d is a sensor that detects touch of a human finger or the like. A flexible printed circuit 12e, which is connected to the controller (not illustrated) such as the CPU incorporated in the wearable device 1, is connected to the touch sensor 12d. For example, a known film TP can be used as the touch panel 12.

Figure 6A:
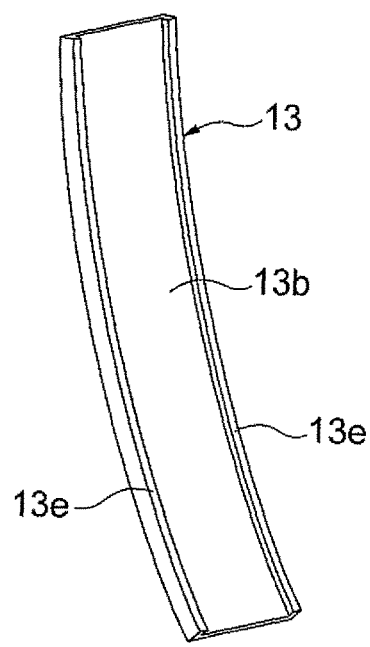
FIG. 6A is a perspective view of an intermediate housing.
Figure 6B:
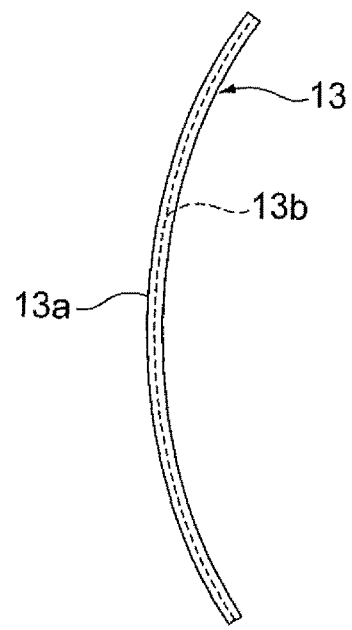
FIG. 6B is a side view of an intermediate housing.
Figure 7A:
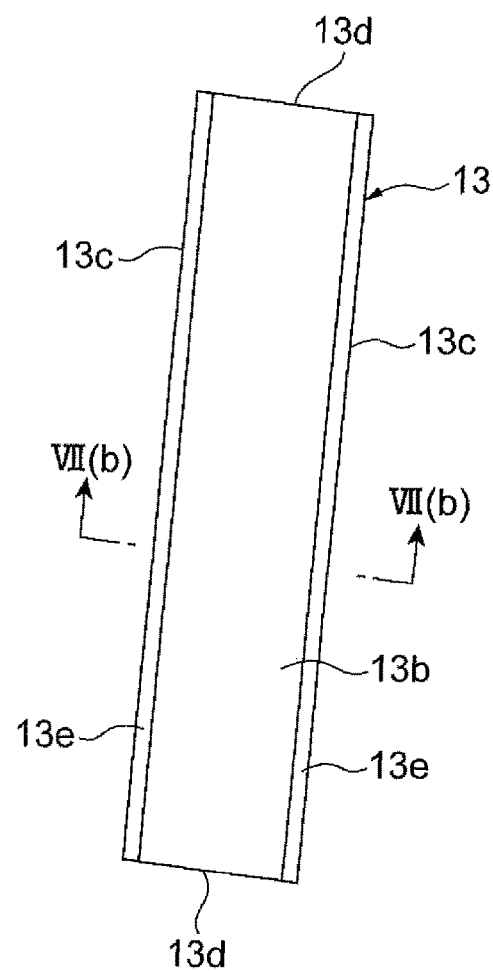
FIG. 7A is a front view of an intermediate housing.
Figure 7B:
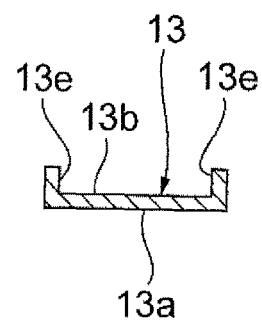
FIG. 7B is a cross-section view of an intermediate housing taken along VII(b)-VII(b) line of FIG. 7A.

FIG. 6A is a perspective view of the intermediate housing, and FIG. 6B is a side view of the intermediate housing. FIG. 7A is a front view of the intermediate housing, and FIG. 7B is a cross-section view of the intermediate housing taken along VII(b)-VII(b) line of FIG. 7A. As illustrated in FIG. 2, FIG. 3, FIGS. 6A and 6B, and FIGS. 7A and 7B, the intermediate housing 13 is a housing of the organic EL display module 10. That is, the intermediate housing 13 is not a housing of the wearable device 1, and is a housing of the organic EL display module 10 assembled with the housing 2 of the wearable device 1.

The intermediate housing 13 is formed in a curved rectangular plate shape. Herein, in surfaces of the intermediate housing 13 facing each other, a convexly curved surface is referred to as a convex surface 13a, and a concavely curved surface is referred to as a concave surface 13b. The intermediate housing 13 has a pair of long sides 13c facing each other, and a pair of short sides 13d facing each other. The intermediate housing 13 is curved such that the pair of long sides 13c becomes curves. A radius of curvature of the intermediate housing 13 is preferably 8 mm or more and 200 mm or less, and more preferably 10 mm or more and 100 mm or less. A thickness of the intermediate housing 13 is preferably 0.05 mm or more and 2 mm or less, and more preferably 0.1 mm or more and 1 mm or less.

The intermediate housing 13 is preferably a resin member, and more preferably has flexibility. For example, polycarbonate, an acrylic resin, a polyethylene terephthalate (PET) resin, polyvinyl chloride, polystyrene, polyethylene, polypropylene, an ABS resin, polyamide, a phenol resin, a polyethylene resin, an epoxy resin, and the like can be used as a resin that forms the intermediate housing 13. Among the above-mentioned resins, polycarbonate is excellent in terms of an optical property such as transmissivity, has high processability, and is sufficiently hard. Further, polycarbonate is a thermoplastic resin, and thus can be thermoformed. Furthermore, polycarbonate is low in price, and thus is suitable for the resin that forms the intermediate housing 13. In addition, at least a portion of the intermediate housing 13 facing the display unit 2a of the housing 2 is preferably transparent. That is, the portion preferably has transmissivity of 3% or more on average in a visible light wavelength region.

The intermediate housing 13 is disposed on the opposite side from the organic EL display device 11 with respect to the touch panel 12. That is, the organic EL display device 11 and the touch panel 12 are disposed on a side of the concave surface 13b of the intermediate housing 13. In addition, the concave surface 13b of the intermediate housing 13 is attached to the convex surface 12a of the touch panel 12.

First convex portions 13e are formed in end portions on sides of the long sides 13c of the intermediate housing 13. The first convex portions 13e extrude from the concave surface 13b of the intermediate housing 13 to sides of the organic EL display device 11 and the touch panel 12. The first convex portions 13e extend along the long sides 13c across the whole region of the long sides 13c. A height at which the first convex portions 13e extrude is not particularly restricted. However, the height is preferably larger than a thickness of the touch panel 12 and smaller than a total thickness of the organic EL display device 11, the touch panel 12, and the protective portion 16.

As illustrated in FIG. 3, the first adhesive portion 14 attaches the organic EL display device 11 and the touch panel 12 to each other. The second adhesive portion 15 attaches the touch panel 12 and the intermediate housing 13 to each other.

At least one of a transparent resin tape and a transparent resin adhesive is used as each of the first adhesive portion 14 and the second adhesive portion 15. That is, the transparent resin tape may be used as the first adhesive portion 14 and the second adhesive portion 15. In addition, the transparent resin adhesive may be used as the first adhesive portion 14 and the second adhesive portion 15. Further, the transparent resin tape may be used as the first adhesive portion 14, and the transparent resin adhesive may be used as the second adhesive portion 15. In addition, the transparent resin adhesive may be used as the first adhesive portion 14, and the transparent resin tape may be used as the second adhesive portion 15.

An OCA (optically clear adhesive) can be used as the transparent resin tape. The OCA is a film-shaped adhesive sheet, and peeling layers are provided on both surfaces of an adhesive film. When the organic EL display device 11 and the touch panel 12 are attached to each other using the OCA, one of the peeling layers is peeled off and attached to one of the organic EL display device 11 and the touch panel 12, and a peeling layer on the other surface is peeled off to bond the organic EL display device 11 and the touch panel 12 together. This description is similarly applied when the touch panel 12 and the intermediate housing 13 are attached to each other using the OCA. In general, referring to the OCA, practical adhesive strength is immediately obtained, and a property is not changed before and after bonding.

An OCR (optically clear resin) can be used as the transparent resin adhesive. The OCR is a liquid or gel-like resin, and is an adhesive hardened by heat, moisture, ultraviolet light, or the like. When the organic EL display device 11 and the touch panel 12 are attached to each other using the OCR, the OCR is applied to the organic EL display device 11 and the touch panel 12, and the organic EL display device 11 and the touch panel 12 are bonded together. Then, after the OCR is spread, the OCR is hardened. This description is similarly applied when the touch panel 12 and the intermediate housing 13 are attached to each other using the OCR. In general, referring to the OCR, reworking is relatively easy when bonding fails, and adhesive tracking performance with respect to a level difference that occurs between bonding members is excellent. In addition, the OCR has excellent response ability when the bonding members are changed, and change of a film thickness or a size is completed by film thickness setting, position adjustment, and the like of a bonding device.

An acrylic resin, a silicone resin, a rubber-based resin such as butadiene or isoprene, a cycloolefin-based resin, can be used as an adhesive component of the first adhesive portion 14 and the second adhesive portion 15. As characteristics of the first adhesive portion 14 and the second adhesive portion 15, it is preferable that the first adhesive portion 14 and the second adhesive portion 15 be optically uniform and transparent, poor adhesion such as detachment and foaming do not occur, and white turbidity, change in size, and the like do not occur under a usage environment. Transmissivity of the first adhesive portion 14 and the second adhesive portion 15 is preferably 90% or more, and haze of the first adhesive portion 14 and the second adhesive portion 15 is preferably 1% or less. A refractive index of the first adhesive portion 14 and the second adhesive portion 15 is dependent on a property of matter present at a contact boundary. However, the refractive index is preferably the same as that of the resin film corresponding to the first substrate 11c of the organic EL display device 11, or a refractive index slightly higher than that of the resin film. For example, the refractive index can be set to be in a range of 1.4 to 1.6.

Figure 8A:
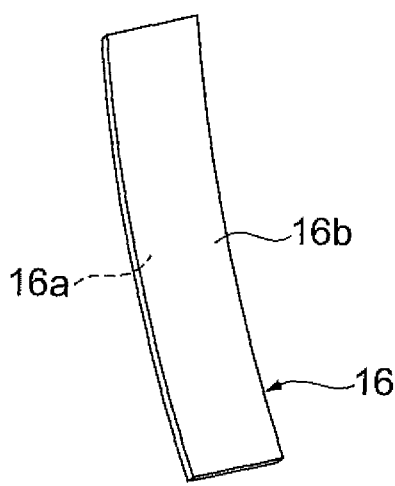
FIG. 8A is a perspective view of a protective portion.
Figure 8B:
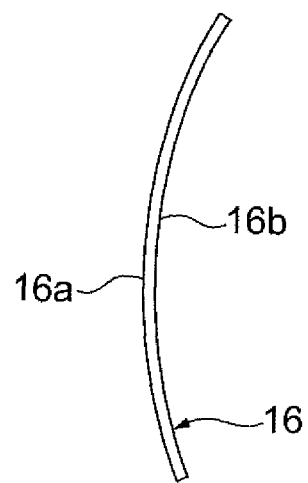
FIG. 8B is a side view of a protective portion.

FIG. 8A is a perspective view of the protective portion, and FIG. 8B is a side view of the protective portion. As illustrated in FIG. 2, FIG. 3, and FIGS. 8A and 8B, the protective portion 16 is a member that protects the organic EL display device 11. The protective portion 16 is formed in a curved rectangular plate shape. Herein, in surfaces of the protective portion 16 facing each other, a convexly curved surface is referred to as a convex surface 16a, and a concavely curved surface is referred to as a concave surface 16b. A radius of curvature of the protective portion 16 is preferably the same as the radius of curvature of the intermediate housing 13. A thickness of the protective portion 16 is preferably 0.02 mm or more and 0.2 mm or less, and more preferably 0.05 mm or more and 0.1 mm or less. Stainless steel, plastic, and the like can be used as a material of the protective portion 16. For example, the same material as that of the intermediate housing 13 can be used as plastic.

The protective portion 16 is disposed on the opposite side from the touch panel 12 of the organic EL display device 11. In addition, the convex surface 16a of the protective portion 16 is attached to the concave surface 11b of the organic EL display device 11.

The third adhesive portion 17 bonds the organic EL display device 11 and the protective portion 16 together. Similarly to the first adhesive portion 14 and the second adhesive portion 15, at least one of a resin tape and a resin adhesive is used as the third adhesive portion 17. However, a surface of the organic EL display device 11 on a side of the protective portion 16 is not a display surface, and thus an optical property similar to that of the first adhesive portion 14 and the second adhesive portion 15 is not required. For this reason, the third adhesive portion 17 may not be transparent, and various resins such as an acrylic resin, a silicone resin, and an epoxy resin can be used as an adhesive component of the third adhesive portion 17.

Next, a description will be given of a method of manufacturing the organic EL display module 10.

First, a description will be given of the manufacturing method when the resin tape is used as the first adhesive portion 14, the second adhesive portion 15, and the third adhesive portion 17.

FIG. 9 is a diagram for description of the method of manufacturing the organic EL display module using the resin tape. As illustrated in FIG. 9, first, the second adhesive portion 15 is bonded to the concave surface 13b of the intermediate housing 13, and the convex surface 12a of the touch panel 12 is bonded to the second adhesive portion 15. Then, the intermediate housing 13 and the touch panel 12 are attached to each other.

Next, the first adhesive portion 14 is bonded to the concave surface 12b of the touch panel 12, and the convex surface 11a of the organic EL display device 11 is bonded to the first adhesive portion 14. Then, the touch panel 12 and the organic EL display device 11 are attached to each other.

Next, the third adhesive portion 17 is bonded to the concave surface 11b of the organic EL display device 11, and the convex surface 16a of the protective portion 16 is bonded to the third adhesive portion 17. Then, the organic EL display device 11 and the protective portion 16 are attached to each other.

In this way, manufacturing of the organic EL display module 10 is completed. The organic EL display module 10 is a module into which the intermediate housing 13, the touch panel 12, the organic EL display device 11, and the protective portion 16 are integrated. That is, the intermediate housing 13, the touch panel 12, the organic EL display device 11, and the protective portion 16 are overlapped one another in this order. In addition, the intermediate housing 13 and the touch panel 12 are attached to each other by the second adhesive portion 15 which is disposed between the intermediate housing 13 and the touch panel 12. Further, the touch panel 12 and the organic EL display device 11 are attached to each other by the first adhesive portion 14 which is disposed between the touch panel 12 and the organic EL display device 11. Furthermore, the organic EL display device 11 and the protective portion 16 are attached to each other by the third adhesive portion 17 which is disposed between the organic EL display device 11 and the protective portion 16.

Next, a description will be given of the manufacturing method when the resin adhesive is used as the first adhesive portion 14, the second adhesive portion 15, and the third adhesive portion 17.

FIGS. 10A, 10B and 10C are a diagram for description of the method of manufacturing the organic EL display module using the resin adhesive. As illustrated in FIG. 10A to 10C, first, the second adhesive portion 15 is applied to the concave surface 13b of the intermediate housing 13. In addition, the convex surface 12a of the touch panel 12 is pressed against the concave surface 13b of the intermediate housing 13. Then, the second adhesive portion 15 is spread, and a space between the intermediate housing 13 and the touch panel 12 is filled with the second adhesive portion 15 without a gap.

Subsequently, the first adhesive portion 14 is applied to the concave surface 12b of the touch panel 12. In addition, the convex surface 11a of the organic EL display device 11 is pressed against the concave surface 12b of the touch panel 12. Then, the first adhesive portion 14 is spread, and a space between the touch panel 12 and the organic EL display device 11 is filled with the first adhesive portion 14 without a gap.

Subsequently, the third adhesive portion 17 is applied to the concave surface 11b of the organic EL display device 11. In addition, the protective portion 16 is pressed against the concave surface 11b of the organic EL display device 11. Then, the third adhesive portion 17 is spread, and a space between the organic EL display device 11 and the protective portion 16 is filled with the third adhesive portion 17 without a gap.

Subsequently, the first adhesive portion 14, the second adhesive portion 15, and the third adhesive portion 17 are hardened by applying heat, moisture, ultraviolet light, and the like to the first adhesive portion 14, the second adhesive portion 15, and the third adhesive portion 17.

In this way, manufacturing of the organic EL display module 10 is completed. The completed organic EL display module 20 is a module into which the intermediate housing 13, the touch panel 12, the organic EL display device 11, and the protective portion 16 are integrated. That is, the intermediate housing 13, the touch panel 12, the organic EL display device 11, and the protective portion 16 are overlapped one another in this order. In addition, the intermediate housing 13 and the touch panel 12 are attached to each other by the second adhesive portion 15 with which the space between the intermediate housing 13 and the touch panel 12 is filled. Further, the touch panel 12 and the organic EL display device 11 are attached to each other by the first adhesive portion 14 with which the space between the touch panel 12 and the organic EL display device 11 is filled. Furthermore, the organic EL display device 11 and the protective portion 16 are attached to each other by the third adhesive portion 17 with which the space between the organic EL display device 11 and the protective portion 16 is filled.

FIG. 11 is a perspective view illustrating a state in which the organic EL display module is assembled with the housing. As illustrated in FIG. 11, the completed organic EL display module 10 is assembled with the housing 2 by a final product manufacturing company that manufactures the wearable device corresponding to a final product. In addition, manufacturing of the wearable device 1 is completed by resin-molding the whole organic EL display module 10.

In this way, in the organic EL display module 10 according to the present embodiment, when the organic EL display device 11 and the touch panel 12 are attached to the intermediate housing 13 using the first adhesive portion 14 and the second adhesive portion 15, the organic EL display device 11 and the touch panel 12 are easily integrated into one module. In this way, a handling property of the organic EL display module 10 is improved. Thus, when the organic EL display module 10 is assembled as the wearable device 1 corresponding to the final product, it is possible to suppress occurrence of a malfunction of the organic EL display device 11 or the touch panel 12. Further, the organic EL display device 11 and the touch panel 12 have flexibility, and the intermediate housing 13 is curved. Thus, the organic EL display module 10 can be easily assembled with the wearable device 1 which has a curved design.

In addition, since the intermediate housing 13 has flexibility, the organic EL display module 10 can be easily assembled with the wearable device 1 which has various shapes.

Further, the organic EL display device 11 and the touch panel 12 are disposed on a side of the concave surface of the intermediate housing 13, and thus the handling property of the organic EL display module 10 is further improved, and damage to the organic EL display device 11 and the touch panel 12 can be further suppressed.

Furthermore, the first convex portions 13e are formed in the end portions on the sides of the long sides 13c of the intermediate housing 13. Thus, when the organic EL display device 11 and the touch panel 12 come into contact with the first convex portions 13e, the organic EL display device 11 and the touch panel 12 can be aligned with the intermediate housing 13 at high accuracy.

In addition, the first convex portions 13e extend along the long sides 13c corresponding to curves, and thus a shape-retaining property of the curved intermediate housing 13 is improved.

Further, the organic EL display device 11, the touch panel 12, and the intermediate housing 13 are attached to one another using the transparent resin tape and the transparent resin adhesive, and thus can be reliably attached to another while ensuring visibility of the organic EL display device 11.

In particular, when the resin adhesive is used as the first adhesive portion. 14, the second adhesive portion 15, and the third adhesive portion 17, a space among the organic EL display device 11, the touch panel 12, and the intermediate housing 13 is filled with the resin adhesive. Thus, the organic EL display device 11, the touch panel 12, and the intermediate housing 13 can be more reliably attached to one another. Further, when the first adhesive portion 14, the second adhesive portion 15, and the third adhesive portion 17 are spread, the first convex portions 13e function as an embankment, and thus the first adhesive portion 14, the second adhesive portion 15, and the third adhesive portion 17 can be prevented from protruding from the intermediate housing 13.

In addition, the radius of curvature of the intermediate housing 13 is 8 mm or more and 200 mm or less, and thus the intermediate housing 13 can be easily assembled with the wearable device 1 which has the curved design to fit along the line of the human body. In particular, the intermediate housing 13 can be suitably used for the wearable device 1 which is used by being put on a finger, a wrist, a leg, an ankle, or the like. For example, when the radius of curvature is about 10 mm, the wearable device 1 can be used as a ring-type wearable device 1. When the radius of curvature is about 40 mm, the wearable device 1 can be used as a wearable device 1 which is put on an arm.

In addition, the thickness of the intermediate housing 13 is 0.05 mm or more and 2 mm or less, and thus rigidity of the organic EL display module 10 can be maintained while preventing the wearable device 1 corresponding to the final product from becoming excessively thick.

Further, the thickness of the first substrate is 0.2 mm or less, and thus the organic EL display device 11 can be easily bent.

Furthermore, the protective portion 16 is disposed on the opposite side from the touch panel 12 of the organic EL display device 11, and thus the organic EL display device 11 and the touch panel 12 are interposed between the intermediate housing 13 and the protective portion 16. In this way, it is possible to further suppress damage to the organic EL display device 11 and the touch panel 12.

Second Embodiment

Next, a description will be given of an organic EL display module of a second embodiment. The organic EL display module of the second embodiment is basically similar to the organic EL display module of the first embodiment. However, the organic EL display module of the second embodiment is different from the organic EL display module of the first embodiment in materials of the intermediate housing and the protective portion, and an adhesion scheme of the first adhesive portion, the second adhesive portion, and the third adhesive portion. For this reason, hereinafter, only a different part from the organic EL display module of the first embodiment will be described and description of a similar part to the organic EL display module of the first embodiment will be omitted.

Figure 12:
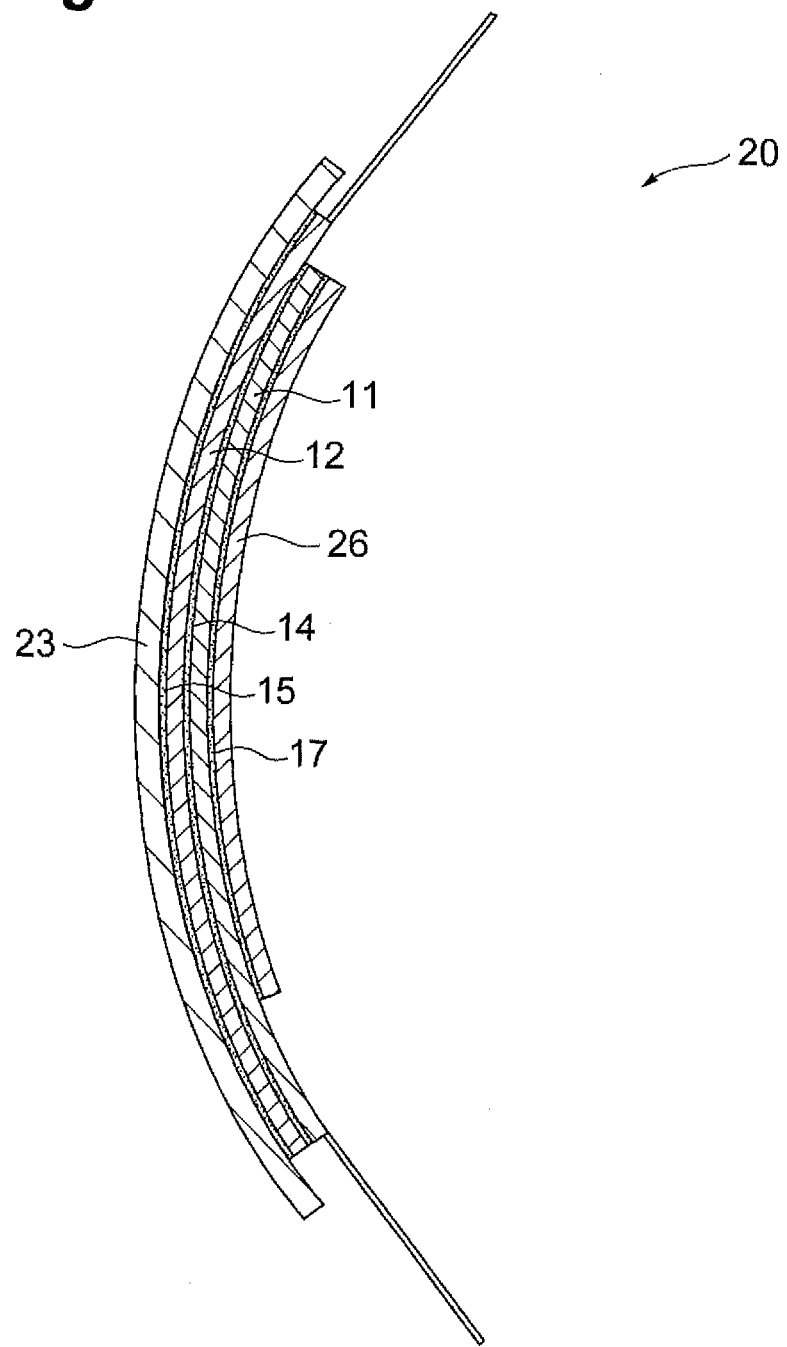
FIG. 12 is a cross-sectional view of an organic EL display module of a second embodiment.

FIG. 12 is a cross-sectional view of the organic EL display module of the second embodiment. As illustrated in FIG. 12, the organic EL display module 20 of the second embodiment includes an organic EL display device 11, a touch panel 12, an intermediate housing 23, a first adhesive portion 14, a second adhesive portion 15, a protective portion 26, and a third adhesive portion 17.

The intermediate housing 23 is similar to the intermediate housing 13 of the first embodiment except that the intermediate housing 23 is formed using a transparent silicone resin.

The protective portion 26 is similar to the protective portion 16 of the first embodiment except that the protective portion 26 is a member formed by applying a silicone resin to a resin substrate such as PET.

Next, a description will be given of a method of manufacturing the organic EL display module 20.

Similarly to the first embodiment, the intermediate housing 23 and the touch panel 12 are attached to each other by the second adhesive portion 15, the touch panel 12 and the organic EL display device 11 are attached to each other by the first adhesive portion 14, and the organic EL display device 11 and the protective portion 26 are attached to each other by the third adhesive portion 17.

Herein, when the intermediate housing 23 is formed using the transparent silicone resin, there is difficulty in attaching the touch panel 12 and the intermediate housing 23 to each other using the resin tape and the resin adhesive, which are used in the first embodiment. This description is similarly applied when the organic EL display device 11 and the protective portion 26 are attached to each other.

For this reason, at least one of an attaching method using the same material as that of the first embodiment as the second adhesive portion 15 and the third adhesive portion 17, and an attaching method using a different material from that of the first embodiment as the second adhesive portion 15 and the third adhesive portion 17 is performed in the second embodiment.

First, a description will be given of the attaching method using the same material as that of the first embodiment as the second adhesive portion 15 and the third adhesive portion 17.

A surface treatment is conducted on a surface of at least one of the intermediate housing 23 and the touch panel 12 such that the intermediate housing 23 and the touch panel 12 are easily attached to each other. Similarly, a surface treatment is conducted on a surface of at least one of the intermediate housing 23 and the touch panel 12 such that the organic EL display device 11 and the protective portion 26 are easily attached to each other. As the surface treatments, for example, a silane coupling agent-based primer can be formed.

Then, after performing these surface treatments, the intermediate housing 23 and the touch panel 12 are attached to each other, and the organic EL display device 11 and the protective portion 26 are attached to each other.

Next, a description will be given of the attaching method using the different material from that of the first embodiment as the second adhesive portion 15 and the third adhesive portion 17.

When a resin adhesive is used as the second adhesive portion 15 and the third adhesive portion 17, a resin adhesive having an excellent adhesive property with respect to silicone is used as the second adhesive portion 15 and the third adhesive portion 17. For example, a silicone-based transparent adhesive containing an adhesiveness-imparting material can be used as the resin adhesive. For example, a silane coupling agent can be used as the adhesiveness-imparting material.

Then, the intermediate housing 23 and the touch panel 12 are attached to each other, and the organic EL display device 11 and the protective portion 26 are attached to each other using the resin adhesive.

In this way, in the organic EL display module 20 of the present embodiment, the intermediate housing 23 and the protective portion 26 are formed using a transparent silicone resin, and thus shapes of the intermediate housing 23 and the protective portion 26 can be easily changed. In this way, even when a design of a wearable device 1 corresponding to a final product is complicated, the organic EL display module 20 can be easily assembled. Further, impact resistance of the intermediate housing 23 and the protective portion 26 can be improved.

Hereinbefore, preferred embodiments of the invention have been described. However, the invention is not limited to the embodiments.

Figure 13A:
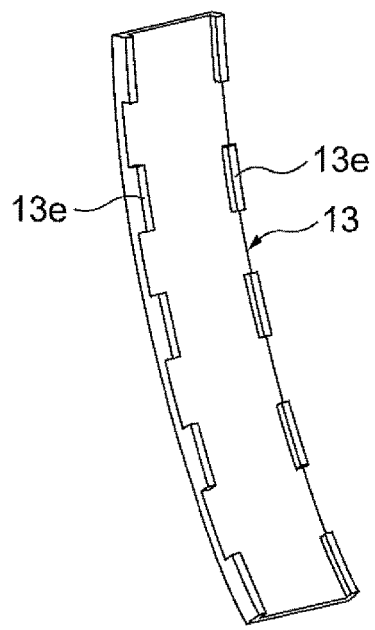
FIGS. 13A and 13B are a perspective view illustrating a modified example of the intermediate housing.

For example, the above embodiments have been described on the assumption that the first convex portions 13e, which are formed in the intermediate housing 13, are formed across the whole region of the long sides 13c of the intermediate housing. However, as illustrated in FIG. 13A, the first convex portions 13e may be formed only in a portion of the long sides 13c of the intermediate housing.

Figure 13B:
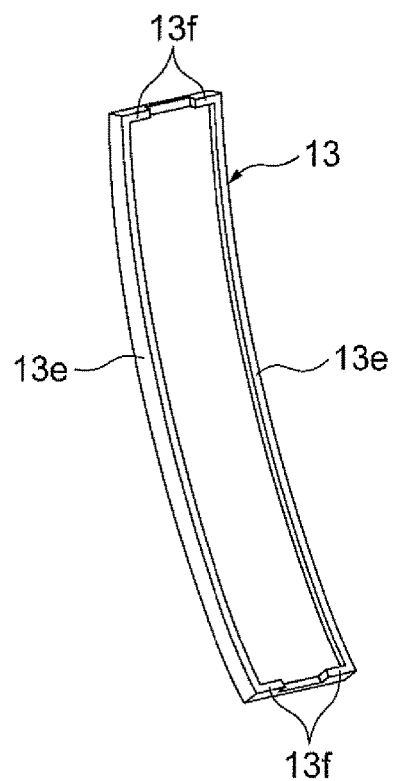

In addition, the above embodiments have been described on the assumption that only the first convex portions 13e are formed in the intermediate housing 13. However, as illustrated in FIG. 13B, second convex portions 13f protruding to sides of the organic EL display device 11 and the touch panel 12 may be formed in end portions on sides of the short sides 13d of the intermediate housing. In this case, the second convex portions 13f are preferably notched in portions in which the flexible printed circuit 11e of the organic EL display device 11 and the flexible printed circuit 12e of the touch panel 12 are disposed. Further, the first convex portions 13e and the second convex portions 13f are preferably connected to each other. When the first convex portions 13e and the second convex portions 13f are connected to each other, corners of the intermediate housing 13 are connected in three axial directions. For this reason, the shape-retaining property of the intermediate housing 13 is further improved.

Figure 14:
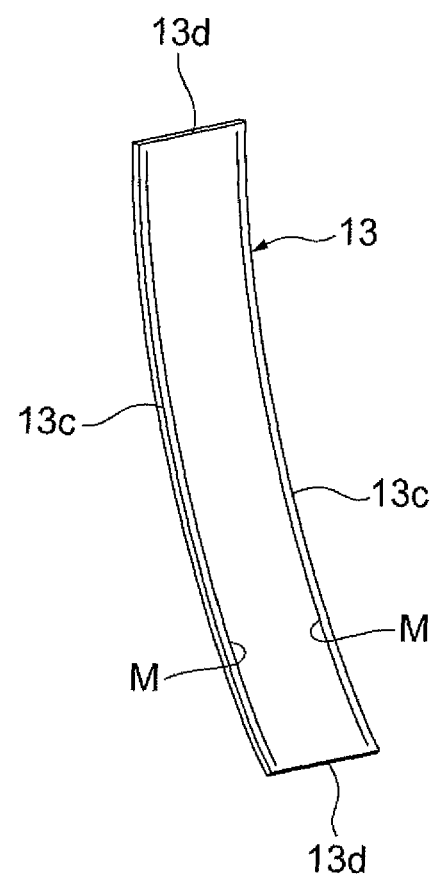
FIG. 14 is a perspective view illustrating another modified example of the intermediate housing.

In addition, in the above embodiments, the first convex portions 13e are formed in the intermediate housing 13 to align the organic EL display device and the touch panel with respect to the intermediate housing 13. However, as illustrated in FIG. 14, the intermediate housing 13 may be formed in a rectangular plate shape, and marks M for alignment may be formed in the end portions on the sides of the long sides 13c of the intermediate housing 13. Examples of the marks M may include lines parallel to the long sides 13c, a plurality of figures arranged in parallel with the long sides 13c, and the like. In this way, since the marks M for alignment are formed in the end portions on the sides of the long sides 13c of the intermediate housing 13, the organic EL display device 11 and the touch panel 12 can be aligned with respect to the intermediate housing 13 at high accuracy based on the marks M.

In addition, even though the above embodiments have been described on the assumption that the protective portion 16 (26) is included, the protective portion 16 (26) may not be included. For example, when damage from a side of the organic EL display device 11 is unlikely to occur at the time of assembling the organic EL display module with the wearable device, the protective portion 16 (26) may not be included. In this case, it is possible to reduce costs.

EXAMPLES

Hereinafter, examples of the invention will be described. However, the invention is not limited to the examples below.

Example 1

In Example 1, an organic EL display module was manufactured using polycarbonate as an intermediate housing.

First, an intermediate housing having a curved surface of a cylindrical shape, a cross section of which has a radius of curvature of 40 mm, was molded using polycarbonate, and first convex portions were provided across a whole region of long sides in both end portions on sides of the long sides. The intermediate housing was fixed to a fixing base which can temporarily fix the intermediate housing, and a resin tape, a touch panel, a resin tape, and an organic EL display device were bonded to the intermediate housing. After bonding was completed, the resin tape, the touch panel, the resin tape, the organic EL display device, and the intermediate housing were heated, pressurized, and hardened using an autoclave and integrated. Thereafter, further, a stainless steel thin plate was bonded to the organic EL display device using a resin adhesive.

At this point in time, operations of the organic EL display device and the touch panel were verified through conduction from a flexible printed circuit, and a test of the organic EL display module was conducted. Then, only non-defective organic EL display modules except for defective goods were provided to a final product manufacturing company. As a result, when the final product manufacturing company assembled the organic EL display modules, a level of defectiveness of wearable devices corresponding to final products was reduced than before.

Example 2

In Example 2, an organic EL display module was manufactured under a similar condition to that of Example 1 except that a radius of curvature of an intermediate housing was set to 8 mm, and a resin adhesive was used instead of the resin tape. As a result, the final product manufacturing company obtained a similar effect to that of Example 1.

Example 3

In Example 3, an organic EL display module was manufactured using a transparent silicone resin as an intermediate housing.

First, the intermediate housing which has the same shape as that of Example 1 was molded using the transparent silicone resin. In addition, a tape-shaped protective portion was prepared using a member obtained by applying a silicone resin to a resin substrate such as PET. Subsequently, as preprocessing, a silane coupling agent-based primer was formed on the surfaces of intermediate housing and the protective portion. Thereafter, the organic EL display module was manufactured under a similar condition to that of Example 1. As a result, a similar effect to that of Example 1 was obtained.

Example 4

In Example 4, an organic EL display module was manufactured using a transparent silicone resin as an intermediate housing.

First, the intermediate housing and a protective portion were manufactured under a similar condition to that of Example 3. Thereafter, the organic EL display module was manufactured under a similar condition to that of Example 1 except that a silicone-based transparent adhesive containing an adhesiveness-imparting material was used as a second adhesive portion and a third adhesive portion. As a result, the final product manufacturing company obtained a similar effect to that of Example 1.

What is claimed is:
1. An organic EL display module comprising:
   an organic EL display device having flexibility;
   a touch panel having flexibility;
   a first adhesive portion for attaching the organic EL display device and the touch panel to each other;
   a curved intermediate housing disposed on an opposite side from the organic EL display device with respect to the touch panel; and
   a second adhesive portion for attaching the touch panel and the intermediate housing to each other, wherein the intermediate housing is formed in a rectangular plate shape, and alignment portions to align the touch panel are formed in end portions on sides of long sides of the intermediate housing.

2. The organic EL display module according to claim 1, wherein the intermediate housing has flexibility.

3. The organic EL display module according to claim 1, wherein the organic EL display device and the touch panel are disposed on a side of a concave surface of the intermediate housing.

4. The organic EL display module according to claim 1, wherein the alignment portions are first convex portions protruding to a side of the organic EL display device.

5. The organic EL display module according to claim 4, wherein the intermediate housing is curved such that the long sides of the intermediate housing become curves, and the first convex portions extend along the long sides of the intermediate housing.

6. The organic EL display module according to claim 4, wherein second convex portions protruding to the side of the organic EL display device are formed in end portions on sides of short sides of the intermediate housing, and the first convex portions and the second convex portions are connected to each other.

7. The organic EL display module according to claim 1, wherein the alignment portions are marks for alignment.

8. The organic EL display module according to claim 1, wherein the intermediate housing is formed using a transparent silicone resin.

9. The organic EL display module according to claim 1, wherein each of the first adhesive portion and the second adhesive portion is at least one of a transparent resin tape and a transparent resin adhesive.

10. The organic EL display module according to claim 1, wherein the first adhesive portion and the second adhesive portion are transparent resin adhesives, and a space between the organic EL display device and the touch panel, and a space between the touch panel and the intermediate housing are filled with the resin adhesives.

11. The organic EL display module according to claim 1, wherein a radius of curvature of the intermediate housing is 8 mm or more and 200 mm or less.

12. The organic EL display module according to claim 1, wherein a thickness of the intermediate housing is 0.05 mm or more and 2 mm or less.

13. The organic EL display module according to claim 1, wherein an organic EL display element is formed on a substrate of the organic EL display device, and a thickness of the substrate is 0.2 mm or less.

14. The organic EL display module according to claim 1, further comprising:

a protection portion disposed on an opposite side from the touch panel of the organic EL display device.

* * * * *